US007684505B2

United States Patent
Rajagopal et al.

(10) Patent No.: US 7,684,505 B2
(45) Date of Patent: Mar. 23, 2010

(54) METHOD AND APPARATUS FOR ENCODING INTERLEAVING AND MAPPING DATA TO FACILITATE GBPS DATA RATES IN WIRELESS SYSTEMS

(75) Inventors: Sridhar Rajagopal, Allen, TX (US); Matthew B. Shoemake, Allen, TX (US); John Terry, Garland, TX (US)

(73) Assignee: QUALCOMM Incorporated, San Diego, CA (US)

( * ) Notice: Subject to any disclaimer, the term of this patent is extended or adjusted under 35 U.S.C. 154(b) by 1216 days.

(21) Appl. No.: 11/114,752

(22) Filed: Apr. 25, 2005
(Under 37 CFR 1.47)

(65) Prior Publication Data
US 2006/0029145 A1 Feb. 9, 2006

Related U.S. Application Data

(60) Provisional application No. 60/565,366, filed on Apr. 26, 2004.

(51) Int. Cl.
*H04L 5/12* (2006.01)

(52) U.S. Cl. ................ 375/265; 375/260; 375/264; 375/341; 375/262; 341/160

(58) Field of Classification Search ............. 375/265, 375/260–262, 341, 264, 295, 298, 269, 279, 375/362, 355, 308, 334, 233–236, 141; 714/752, 714/755, 756, 759, 810, 795, 792, 777, 793, 714/796; 708/5, 8, 21, 404; 341/160, 81
See application file for complete search history.

(56) References Cited

U.S. PATENT DOCUMENTS

| 5,870,405 | A | * | 2/1999 | Hardwick et al. | 714/701 |
| 6,115,427 | A | * | 9/2000 | Calderbank et al. | 375/267 |
| 6,493,815 | B1 | * | 12/2002 | Kim et al. | 711/217 |
| 6,704,368 | B1 | * | 3/2004 | Nefedov | 375/265 |
| 7,023,934 | B2 | * | 4/2006 | Tran et al. | 375/341 |
| 2004/0151109 | A1 | * | 8/2004 | Batra et al. | 370/208 |

OTHER PUBLICATIONS

Viterbi, "Error Bounds for Convolutional Codes and an Asymptotically Optimum Decoding Algorithm", IEEE Transactions on Information Theory, vol. IT-13, No. 2, Apr. 1967, pp. 260-269.

* cited by examiner

*Primary Examiner*—David C Payne
*Assistant Examiner*—Rahel Guarino
(74) *Attorney, Agent, or Firm*—Dang M. Vo

(57) ABSTRACT

A method and apparatus for encoding data for wireless transmission. The invention includes multi-level coding in which data is partitioned between two encoders, one for encoding Most Significant Bits (MSBs) and the other for encoding Least Significant Bits (LSBs). By partition bits separately for the MSBs and LSBs, the complexity of the decoder may be reduced. The MSBs and LSBs are interleaved such that each MSB is a function of just one LSB, simplifying branch metric selection during Viterbi decoding. This also allows parallel de-interleaving by the receiver, which reduces the interleaving latency of the receiver. A block interleaver jointly optimizes the symbol hamming distance of the symbols and the bit hamming distance of each constituent encoder for the MSBs and LSBs.

22 Claims, 12 Drawing Sheets

METHOD AND APPARATUS FOR ENCODING INTERLEAVING AND MAPPING DATA TO FACILITATE GBPS DATA RATES IN WIRELESS SYSTEMS

CROSS-REFERENCE TO RELATED APPLICATIONS

This application claims the benefit of and priority to U.S. Provisional Patent Application No. 60/565,366 filed Apr. 26, 2004 the technical disclosures of which are hereby incorporated herein by reference.

TECHNICAL FIELD

The present invention relates generally to wireless communication systems and more specifically to encoding and decoding of data for high data rate systems.

BACKGROUND OF THE INVENTION

Many wireless systems implement encoders and decoders for reliable transmission of data across wireless channels. The purpose of forward error correction (FEC) is to improve the capacity of a channel by adding carefully designed redundant information to the data being transmitted through the channel. The process of adding this redundant information is known as channel coding. The two major forms of channel coding are convolutional coding and block coding. Convolutional codes operate on serial data, one or a few bits at a time, while block codes operate on relatively large (e.g., couple hundred bytes) message blocks.

The most popular among the schemes is the use of Binary Convolutional Codes (BCCs) for encoding the data and a Viterbi decoder for decoding the data. Viterbi decoding at the receiver is one of the most sophisticated blocks in the physical layer.

With the FCC recently (2002) providing GHz bandwidth in the unlicensed spectrum, it is now possible to provide data rates exceeding Gigabytes per second (Gbps) in wireless systems. However, providing Gbps data rates in a wireless system using convolutional encoding and Viterbi decoding requires the processing of more than a billion sequential Add-Compare-Select (ACS) operations in one second. This task is not possible to achieve with current state of the art hardware, as the time needed to perform an ACS operation exceeds one nanosecond. Hence, multiple Viterbi decoders are needed to operate in parallel to meet real-time constraints. Unfortunately, this solution greatly increases hardware complexity and reduces the efficiency of the Viterbi decoder.

This is a relatively new problem, since previously not enough bandwidth was available in wireless systems to make it an issue. Hence, there was no need to design such high speed decoders. Current Viterbi decoders can go up to 480 Mbps for systems using Ultra-Wide Band (UWB). Multiple decoders make Gbps rate possible but at a significant increase in hardware cost.

Therefore, it would be desirable to have a solution for designing Gbps wireless systems with reduced decoder complexity compared to traditional designs for Gbps systems.

SUMMARY OF THE INVENTION

The present invention provides a method and apparatus for encoding data for wireless transmission. The invention includes multi-level coding in which data is partitioned between two encoders, one for encoding Most Significant Bits (MSBs) and the other for encoding Least Significant Bits (LSBs). By partitioning bit sequences separately for the MSBs and LSBs, the complexity of the decoder may be reduced.

The MSBs and LSBs are interleaved such that each MSB is a function of just one LSB, simplifying branch metric selection during Viterbi decoding. This also allows parallel de-interleaving by the receiver, which reduces the interleaving latency of the receiver.

A block interleaver jointly optimizes the symbol hamming distance of the symbols and the bit hamming distance of each constituent encoder for the MSBs and LSBs.

The increased performance provided by the encoding method of the present invention facilitates Gbps data transmission, while also reducing the complexity of signal decoders.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

DETAILED DESCRIPTION OF THE DRAWINGS

Convolutional encoding with Viterbi decoding is a FEC technique that is particularly suited to a channel in which the transmitted signal is corrupted mainly by additive white Gaussian noise (AWGN), which is noise with a voltage distribution over time that can be described using a Gaussian statistical distribution (i.e. a bell curve). This voltage distribution has zero mean and a standard deviation that is a function of the signal-to-noise ratio (SNR) of the received signal. Assuming that the signal level is fixed, if the SNR is high, the standard deviation of the noise is small, and vice-versa. For digital communications, the SNR is usually measured in terms of $E_b/N_0$, which stands for energy per bit divided by the one-sided noise density.

For example, a bipolar non-return-to-zero (NRZ) signaling a system has a '1' channel bit that is transmitted as a voltage of −1V, and a '0' channel bit transmitted as a voltage of +1V. This is also called binary "antipodal" signaling. A comparator in the receiver determines the received channel bit is a '1' if its voltage is less than 0V, and a '0' if its voltage is greater than or equal to 0V.

Figure 1:
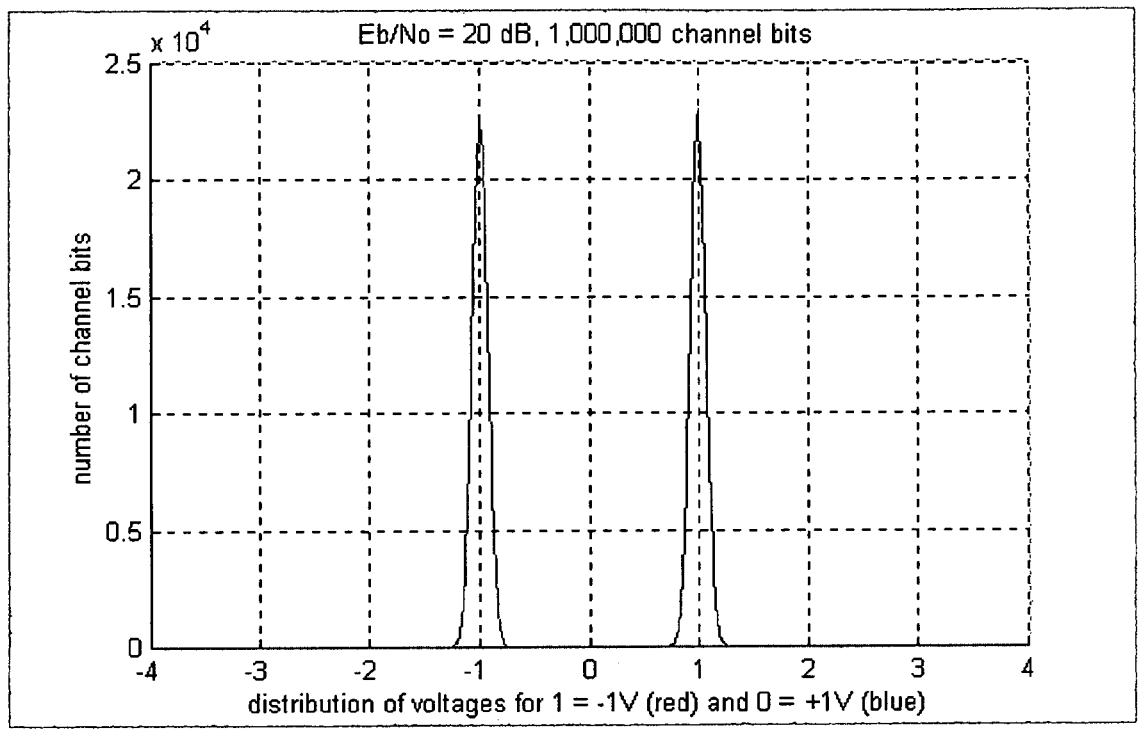
FIG. 1 shows a channel simulation wherein one million channel bits are transmitted through an AWGN channel with an $E_b/N_0$ level of 20 dB.

FIG. 1 shows a channel simulation wherein one million ($1 \times 10^6$) channel bits are transmitted through an AWGN channel with an $E_b/N_0$ level of 20 dB (i.e. the signal voltage is ten times the noise voltage). In this example, a '1' channel bit is transmitted at a level of −1V, and a '0' channel bit is transmitted at a level of +1V. The x axis of the figure corresponds to the received signal voltages, and the y axis represents the number of times each voltage level was received.

Of course, the voltage values of the transmission are not going to be exactly −1V or +1V. As can be seen in the figure, there is a small distribution of voltages around the −1V and +1V values. The values under the curves are referred to as soft numbers. An ideal Viterbi decoder would work with infinite precision, or at least with floating-point numbers. In practical systems, the received channel symbols are quantized with one or a few bits of precision in order to reduce the complexity of the Viterbi decoder. If the received channel symbols are quantized to one-bit precision (<0V=1, ≧0V=0), the result is called hard-decision data. If the received channel symbols are quantized with more than one bit of precision, the result is called soft-decision data. The usual quantization precision is three bits. More bits provide little additional improvement.

In this case, the receiver has little difficulty correctly receiving a signal. Very few (if any) channel bit reception errors occur (i.e. a transmitted '0' is never received as a '1', and a transmitted '1' is never received as a '0').

Figure 2:
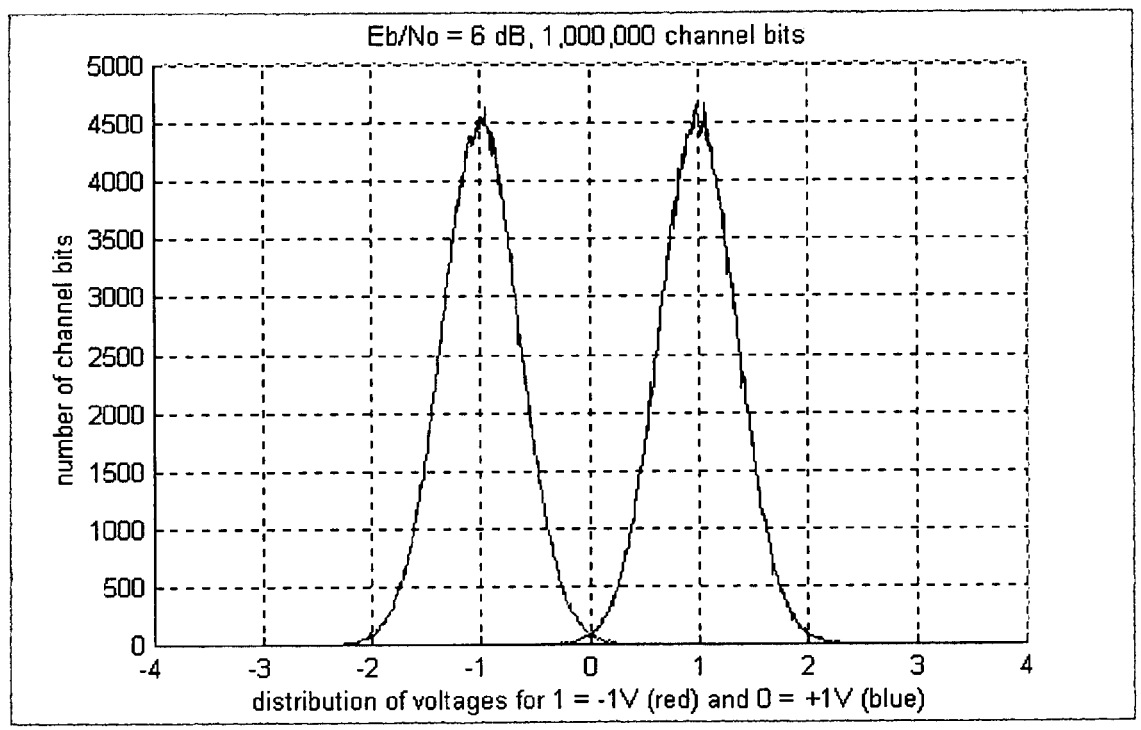
FIG. 2 shows the results of a channel simulation wherein one million channel bits are transmitted through an AWGN channel with an $E_b/N_0$ level of 6 dB.

In contrast, FIG. 2 shows the results of a channel simulation wherein $1 \times 10^6$ channel bits are transmitted through an AWGN channel with an $E_b/N_0$ level of 6 dB (i.e. the signal voltage is only two times the noise voltage). At the bottom of the graph in the middle of the x axis one can see how the right-hand side of the left curve in the crosses 0V, and how the left-hand side of the right curve also crosses 0V. The points on the left curve that are above 0V represent events where a channel bit that was transmitted as a '1' (−1V) was received as a '0'. The points on the right curve that are below 0V represent events where a channel bit that was transmitted as a '0' (+1 V) was received as a '1'. These events correspond to channel bit reception errors.

In the example shown in FIG. 2, a transmitted '0' was received as a '1' 1,147 times, and a transmitted '1' was received as a '0' 1,207 times, corresponding to a bit error rate (BER) of about 0.235%. By applying convolutional coding with Viterbi decoding, a BER of better than $1 \times 10^{-7}$ can be achieved at the same $E_b/N_0$ value of 6 dB.

Convolutional codes are usually described using two parameters: 1) code rate and 2) constraint length. The code rate is expressed as a ratio of the number of bits into the convolutional encoder (k) to the number of channel symbols output by the convolutional encoder (n) in a given encoder cycle.

The constraint length parameter, K, denotes the length of the convolutional encoder, i.e. how many k-bit stages are available to feed the combinatorial logic that produces the output symbols. The parameter m indicates how many encoder cycles an input bit is retained and used for encoding after it first appears at the input to the encoder. The m parameter can be thought of as the memory length of the encoder.

Figure 3:
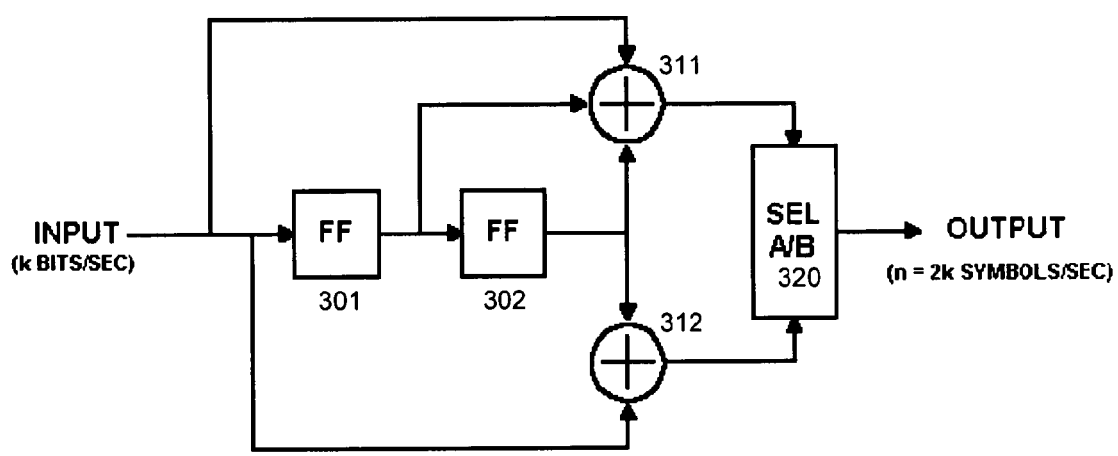
FIG. 3 shows a typical convolutional encoder.

FIG. 3 shows a typical convolutional encoder. Encoding the data is accomplished using a shift register and associated combinatorial logic that performs modulo-two addition. A shift register is a chain of flip-flops wherein the output of the nth flip-flop is tied to the input of the (n+1)th flip-flop. Every time the active edge of the clock occurs, the input to the flip-flop is clocked through to the output, and the data are shifted over one stage.

The combinatorial logic is often in the form of cascaded exclusive-or (XOR gates, which are two-input/one-output gates that implement the following truth-table:

TABLE 1

| Input A | Input B | Output (A XOR B) |
|---------|---------|------------------|
| 0 | 0 | 0 |
| 0 | 1 | 1 |
| 1 | 0 | 1 |
| 1 | 1 | 0 |

The XOR gate performs modulo-two addition of its inputs. When q two-input XOR gates are cascaded, with the output of the first one feeding one of the inputs of the second one, and the output of the second gate feeding one of the inputs to a third gate, etc., the output of the last XOR gate in the chain is the modulo-two sum of the q+1 inputs.

In the encoder depicted in FIG. 3, input data is provided at a rate of k bits per second, and channel symbols are output at a rate of n=2 k symbols per second. The input bit is stable during the encoder cycle.

The encoding cycle starts when an input clock edge occurs, at which point the output of the left-hand flip-flop 301 is clocked into the right-hand flip-flop 302. The previous input bit is clocked into the left-hand flip-flop 301, and a new input bit becomes available. The outputs of the upper and lower XOR gates 311, 312 then become stable.

The output selector 320 cycles through two states. In the first state, it selects and outputs the output of the upper XOR gate 311. In the second state, it selects and outputs the output of the lower XOR gate 312.

The example encoder in FIG. 3 encodes the K=3, (7, 5) convolutional code. The octal numbers 7 and 5 represent the code generator polynomials, which when read in binary ($111_2$ and $101_2$) correspond to the shift register connections to the upper and lower modulo-two adders 311, 312, respectively.

The following example illustrates an input data stream and the corresponding output data stream produced by the convolutional encoder.

Starting with the input sequence be $010111001010001_2$, the outputs of both of the flip-flops 301, 302 in the shift register are initially cleared (i.e. their outputs are '0'). The first clock cycle makes the first input bit ('0') available to the encoder. The flip-flop outputs are both zeroes, making the inputs to the modulo-two adders 311, 312 all zeroes. Therefore, the output of the encoder is $00_2$.

The second clock cycle makes the second input bit ('1') available to the encoder. The left-hand flip-flop 301 clocks in the previous bit ('0'), and the right-hand flip-flop 302 clocks in the '0' output by the left-hand flip-flop. The inputs to the upper XOR gate 311 are $100_2$. Therefore, its output is '1'. The inputs to the bottom XOR gate 312 are $10_2$, so its output is also '1'. The encoder outputs $11_2$ for the channel symbols.

The third clock cycle makes the third input bit ('0') available to the encoder. The left-hand flip-flop 301 clocks in the previous bit ('1') and the right-hand flip-flop clocks in the '0' from two bit-times previously. The inputs to the top XOR gate 311 are $010_2$, making the output '1'. The inputs to the bottom XOR gate 312 are $00_2$, SO the output is '0'. The encoder outputs $10_2$ for the channel symbols.

Figure 4:
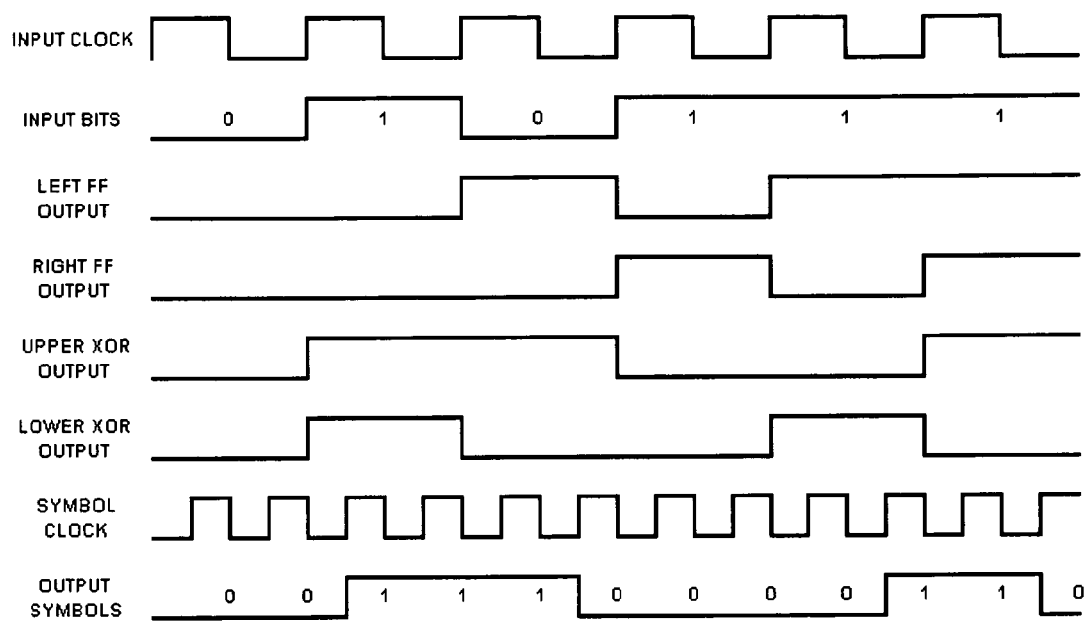
FIG. 4 shows a timing diagram for a convolutional encoder.

The timing diagram shown in FIG. 4 illustrates the process described above.

After all of the inputs have been presented to the encoder, the output sequence is: 00 11 10 00 01 10 01 11 11 10 00 10 11 00 $11_2$. The first bit in each pair is the output of the upper XOR gate, and the second bit in each pair is the output of the lower XOR gate. As can be seen from the structure of the rate 1/2 K=3 convolutional encoder and from the above example, each input bit has an effect on three successive pairs of output symbols. This characteristic gives the convolutional code its error-correcting power, which will become evident in the description of Viterbi decoding below.

In order for the last bit to affect three pairs of output symbols when sending the 15 (input) data bits above, two more pairs of output symbols are needed. The encoder accomplishes this by clocking the convolutional encoder flip-flops two (m) more times, while holding the input at zero. This is called "flushing" the encoder, and results in two more pairs of output symbols. The final binary output of the encoder is: 00 11 10 00 01 10 01 11 11 10 00 10 11 00 11 10 $11_2$. Without the flushing operation, the last m bits of the message have less error-correction capability than the preceding bits had.

Thinking of the encoder as a simple state machine, the example encoder has two bits of memory, allowing four possible states. The following state transition table shows the next state given the current state and input, with the states shown in binary:

TABLE 2

| Current State | Next State, if | |
|---|---|---|
| | Input = 0: | Input = 1: |
| 00 | 00 | 10 |
| 01 | 00 | 10 |
| 10 | 01 | 11 |
| 11 | 01 | 11 |

Giving the left-hand flip-flop a binary weight of $2^1$, and the right-hand flip-flop a binary weight of $2^0$, initially, the encoder is in the all-zeroes state. If the first input bit is a zero, the encoder stays in the all zeroes state at the next clock edge. If the first input bit is a one, the encoder transitions to the $10_2$ state at the next clock edge. If the next input bit is zero, the encoder transitions from a current state of $10_2$ to the $01_2$ state, otherwise, it transitions to the $11_2$ state if the next input bit is a one.

The following output table lists the channel output symbols, given the current state and the input data:

TABLE 3

| Current State | Output State, if | |
|---|---|---|
| | Input = 0: | Input = 1: |
| 00 | 00 | 11 |
| 01 | 11 | 00 |
| 10 | 10 | 01 |
| 11 | 01 | 10 |

With Tables 2 and 3, one can completely describe the behavior of the example rate 1/2, K=3 convolutional encoder. Both tables have $2^{(K-1)}$ rows, and $2^k$ columns, where K is the constraint length and k is the number of bits input to the encoder for each cycle.

Mapping the one/zero output of the convolutional encoder onto an antipodal signaling scheme is a matter of translating zeroes to +1 s and ones to −1 s. This translation can be accomplished by performing the operation y=1−2x on each output symbol.

Viterbi decoding was developed by Andrew J. Viterbi. His seminal paper on the technique is "Error Bounds for Convolutional Codes and an Asymptotically Optimum Decoding Algorithm," *IEEE Transactions on Information Theory*, Volume IT-13, April 1967, pages 260-269, the contents of which are hereby incorporated by reference.

Figure 5A:
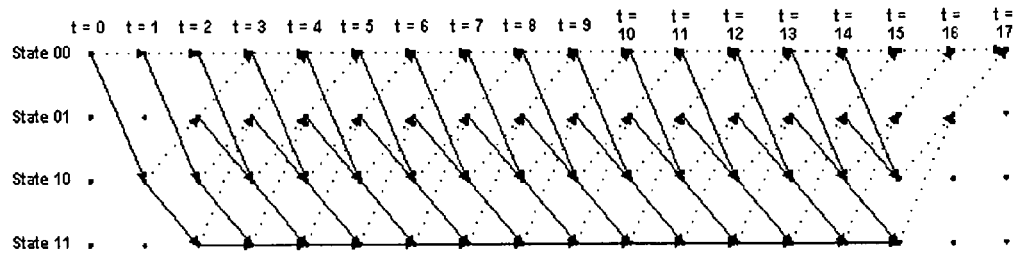
FIG. 5A shows the Viterbi trellis diagram for a 15-bit message from rate 1/2 K=3 convolutional encoder.

An important concept for understanding Viterbi decoding is the trellis diagram. FIG. 5A shows the trellis diagram for the above example rate 1/2 K=3 convolutional encoder for a 15-bit message.

The four possible states of the encoder are depicted as four rows of horizontal dots. There is one column of four dots for the initial state of the encoder and one for each time instant during the message. For a 15-bit message with two encoder memory flushing bits, there are 17 time instants in addition to t=0 (the initial state). The solid lines connecting the dots represent state transitions when the input bit is a one. The dotted lines represent state transitions when the input bit is a zero. Note that since the initial condition of the encoder is State $00_2$, and the two memory flushing bits are zeroes, the arrows start out at State $00_2$ and end up at the same state.

Figure 5B:
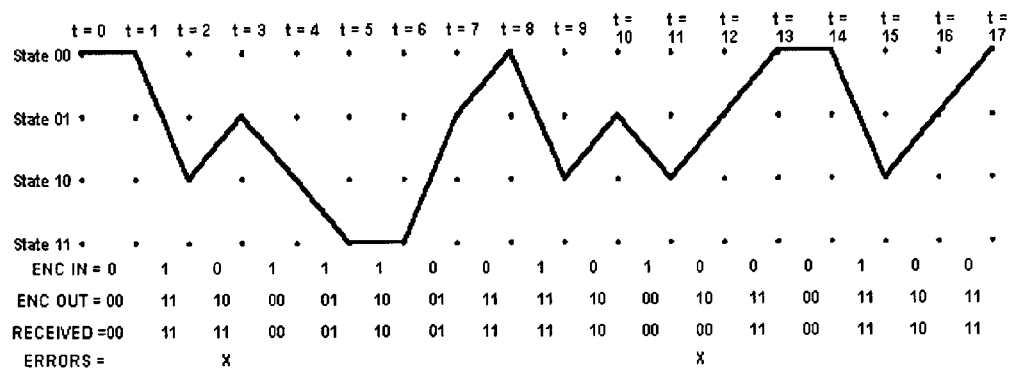
FIG. 5B shows the states of the trellis that are actually reached during the encoding of the example 15-bit message.

FIG. 5B shows the states of the trellis that are actually reached during the encoding of the example 15-bit message. The encoder input bits and output symbols are shown at the bottom of the diagram. In the present example, the received encoded message contains a couple of bit errors.

Each time a pair of channel symbols is received, the decoder computes a metric to measure the "distance" between what was in fact received and all of the possible channel symbol pairs that could have been received. Going from t=0 to t=1, there are only two possible channel symbol pairs that could have been received: $00_2$, and $11_2$. That is because the convolutional encoder was initialized to the all-zeroes state. Given one input bit=one or zero, there are only two states to transition to and two possible outputs of the encoder. These possible outputs of the encoder are $00_2$ and $11_2$.

The metric used for the present example is the Hamming distance between the received channel symbol pair and the possible channel symbol pairs. The Hamming distance is computed by simply counting how many bits are different between the received channel symbol pair and the possible channel symbol pairs. The results can only be zero, one, or two. Branch metrics are the Hamming distance values (or other metric) computed at each time instant for the paths between the states at the previous time instant and the states at the current time instant. In the example below, these results will be saved as "accumulated error metric" values for the first time instant associated with states. For the second time instant on, the accumulated error metrics will be computed by adding the previous accumulated error metrics to the current branch metrics.

Figure 6A:
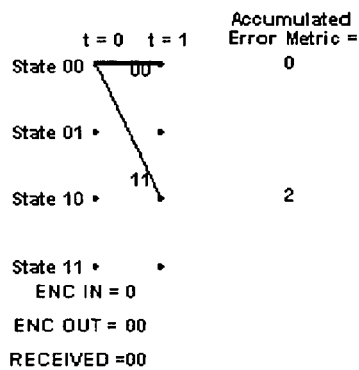
FIG. 6A illustrates the results of the metric calculations for the transition from the initial state to the first time unit.

FIG. 6A illustrates the results of the metric calculations for the transition from the initial state to the first time unit. At t=1, the symbol pair $00_2$ is received. The only possible channel symbol pairs that could have been received are $00_2$ and $11_2$. Therefore, the Hamming distance between $00_2$ and $00_2$ is zero. The Hamming distance between $00_2$ and $11_2$ is two. Therefore, the branch metric value for the branch from State $00_2$ to State $00_2$ is zero, and for the branch from State $00_2$ to State $10_2$ it is two, as illustrated in FIG. 6A. Since the previous accumulated error metric values are equal to zero, the accumulated metric values for State $00_2$ and for State $10_2$ are equal to the branch metric values. The accumulated error metric values for the other two states are undefined.

The solid lines between states at t=0 and the state at t=1 illustrate the predecessor-successor relationship between the states. This information is shown graphically in FIG. 6A, but is stored numerically in the actual implementation. At each time instant t, the decoder stores the number of the predecessor state that led to each of the current states at t.

Figure 6B:
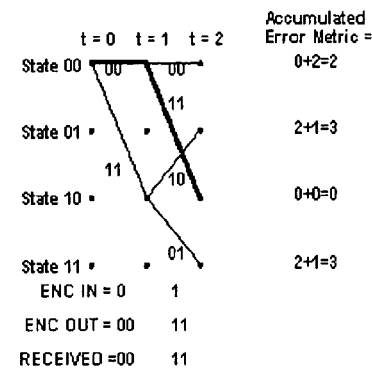
FIG. 6B illustrates the results of the metric calculations for the transition from the first to second time unit.

FIG. 6B illustrates the results of the metric calculations for the transition from the first to second time unit. At t=2 the received channel symbol pair is $11_2$. The possible channel symbol pairs that could have been received in going from t=1 to t=2 are:

$00_2$ going from State $00_2$ to State $00_2$,
$11_2$ going from State $00_2$ to State $10_2$,
$10_2$ going from State $10_2$ to State $01_2$,
and $01_2$ going from State $10_2$ to State $11_2$.

The Hamming distance between $00_2$ and $11_2$ is two, between $11_2$ and $11_2$ it is zero, and between $10_2$ or $01_2$ and $11_2$ it is one. These branch metric values are added to the previous accumulated error metric values associated with each previous state to get to the current states.

At t=1, the only possible states were $00_2$ or $10_2$. The accumulated error metric values associated with those states were 0 and 2 respectively. FIG. 6B shows the calculation of the accumulated error metric associated with each state, at t=2. The accumulated error metrics for each state are carried forward to t=3, along with the predecessor states for each of the four states at t=2, corresponding to the state relationships shown by the solid lines in the illustration of the trellis.

Figure 6C:
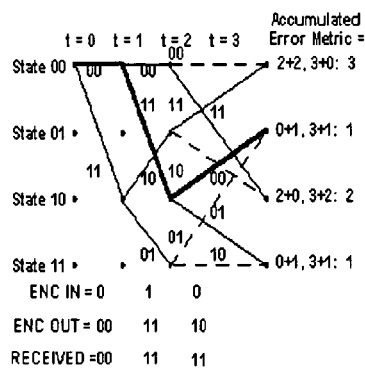
FIG. 6C illustrates the results of the metric calculations for the to the third time unit.

FIG. 6C illustrates the results of the metric calculations for the to the third time unit. There are now two different ways to get from each of the four states that were valid at t=2 to the four states that are valid at t=3. The accumulated error metrics associated with each branch are compared with each other, and the larger one of each pair of branches leading into a given state is discarded. If the members of a pair of accumulated error metrics going into a particular state are equal, that value is saved.

For each state, the predecessor that survives is the one with the lower branch metric. If the two accumulated error metrics are equal, one approach is to choose a surviving predecessor state at random. Another approach is to simply pick one of them consistently, i.e. the upper branch or the lower branch. The operation of adding the previous accumulated error metrics to the new branch metrics, comparing the results, and selecting the smaller (smallest) accumulated error metric to be retained for the next time instant is called the add-compare-select (ACS) operation.

In the present example, the third channel symbol pair that was received had a one-symbol error. The smallest accumulated error metric is one, and there are two of these.

Figure 6D:
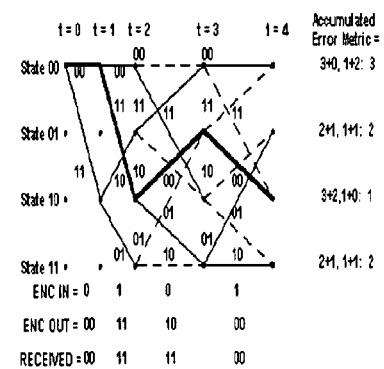
FIG. 6D shows the calculation for the fourth time unit.

FIG. 6D shows the results at t=4. The processing is the same as it was for t=3. At t=4, the path through the trellis of the actual transmitted message (shown in bold) is again associated with the smallest accumulated error metric. This is the feature that the Viterbi decoder exploits to recover the original message.

The calculation process is continued for each time unit through t=17, producing the trellis shown in FIG. 5B.

The decoding process begins by building the accumulated error metric for a specified number of received channel symbol pairs, and the history of what states preceded the states at each time instant t with the smallest accumulated error metric. The Viterbi decoder is then ready to recreate the sequence of bits that were input to the convolutional encoder when the message was encoded for transmission. This process is accomplished by the following steps:

Selecting the state having the smallest accumulated error metric and saving the state number of that state.

Working backward through the state history table for the selected state by selecting the predecessor state listed in the state history table and saving that number. This is performed iteratively until the beginning of the trellis is reached. This process is called traceback.

Working forward through the list of selected states saved in the previous steps and looking up which input bit corresponds to a transition from each predecessor state to its successor state. That is the bit that must have been encoded by the convolutional encoder.

Table 4 shows the accumulated metric for the full 15-bit (plus two flushing bits) example message at each time t. For this hard-decision-input Viterbi decoder example, the smallest accumulated error metric in the final state indicates how many channel symbol errors occurred.

TABLE 4

| | t = | | | | | | | | | | | | | | | | | |
|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 |
| State $00_2$ | 0 | | 2 | 3 | 3 | 3 | 3 | 4 | 1 | 3 | 4 | 3 | 3 | 2 | 2 | 4 | 5 | 2 |
| State $01_2$ | | | | 3 | 1 | 2 | 2 | 3 | 1 | 4 | 4 | 1 | 4 | 2 | 3 | 4 | 4 | 2 |
| State $10_2$ | | 2 | 0 | 2 | 1 | 3 | 3 | 4 | 3 | 1 | 4 | 1 | 4 | 3 | 3 | 2 | | |
| State $11_2$ | | | | 3 | 1 | 2 | 1 | 1 | 3 | 4 | 4 | 3 | 4 | 2 | 3 | 4 | 4 | |

Table 5 is the state history table that shows the surviving predecessor states for each state at each time t.

TABLE 5

| | t = | | | | | | | | | | | | | | | | | |
|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 |
| State $00_2$ | 0 | 0 | 0 | 1 | 0 | 1 | 1 | 0 | 1 | 0 | 0 | 1 | 0 | 1 | 0 | 0 | 0 | 1 |
| State $01_2$ | 0 | 0 | 2 | 2 | 3 | 3 | 2 | 3 | 3 | 2 | 2 | 3 | 2 | 3 | 2 | 2 | 2 | 0 |
| State $10_2$ | 0 | 0 | 0 | 0 | 1 | 1 | 1 | 0 | 1 | 0 | 0 | 1 | 1 | 0 | 1 | 0 | 0 | 0 |
| State $11_2$ | 0 | 0 | 2 | 2 | 3 | 2 | 3 | 2 | 3 | 2 | 2 | 3 | 2 | 3 | 2 | 2 | 0 | 0 |

Table 6 shows the states selected when tracing the path back through the survivor states in Table 5.

| | t = | | | | | | | | | | | | | | | | | |
|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | |
| 0 | 0 | 2 | 1 | 2 | 3 | 3 | 1 | 0 | 2 | 1 | 2 | 1 | 0 | 0 | 2 | 1 | 0 | |

Table 7 maps state transitions to the inputs that caused them. Using this table for the example rate 1/2 K=3 convolutional code, the Viterbi decoder can recreate the original message. In Table 7, x denotes an impossible transition from one state to another state.

TABLE 7

| | Input was, Given Next State = | | | |
|---|---|---|---|---|
| Current State | $00_2 = 0$ | $01_2 = 1$ | $10_2 = 2$ | $11_2 = 3$ |
| $00_2 = 0$ | 0 | x | 1 | x |
| $01_2 = 1$ | 0 | x | 1 | x |
| $10_2 = 2$ | x | 0 | x | 1 |
| $11_2 = 3$ | x | 0 | x | 1 |

Using the above table, the Viterbi decoder can recreate the original message, shown in Table 8. At this point, the two flushing bits are discarded.

TABLE 8

| t = | | | | | | | | | | | | | | |
|---|---|---|---|---|---|---|---|---|---|---|---|---|---|---|
| 1 | 2 | 3 | 4 | 5 | 6 | 7 | 8 | 9 | 10 | 11 | 12 | 13 | 14 | 15 |
| 0 | 1 | 0 | 1 | 1 | 1 | 0 | 0 | 1 | 0 | 1 | 0 | 0 | 0 | 1 |

For the example 15-bit message, the trellis was built up for the entire message before starting traceback. For longer messages, or continuous data, this is neither practical nor desirable due to memory constraints and decoder delay. A traceback depth of K×5 is sufficient for Viterbi decoding with the type of codes discussed above. Any deeper traceback increases decoding delay and decoder memory requirements, while not significantly improving the performance of the decoder. The exception is punctured codes. They require deeper traceback to reach their final performance limits. Depths of K×7, K×9, or even more may be required to reach the point of diminishing returns.

Punctured codes are a common way of achieving higher code rates (i.e. larger ratios of k to n). Punctured codes are created by first encoding data using a rate 1/n encoder, such as the example encoder described above, and then deleting some of the channel symbols at the output of the encoder. This process of deleting channel output symbols is called puncturing.

For example, to create a rate 3/4 code from the rate 1/2 code described above, one would delete channel symbols in accordance with the following puncturing pattern:

TABLE 9

| 1 | 0 | 1 |
|---|---|---|
| 1 | 1 | 0 | where a '1' indicates that a channel symbol is to be transmitted, and a '0' indicates that a channel symbol is to be deleted. To see how this make the rate 3/4, think of each column of Table 9 as corresponding to a bit input into the encoder, and each '1' in the table as corresponding to an output channel symbol. There are three columns in the table, and four '1's.

As another example, to create a rate 2/3 code using a rate 1/2 encoder, one can use the puncturing pattern in Table 10, which has two columns and three ones.

TABLE 10

| 1 | 1 |
|---|---|
| 1 | 0 |

To decode a punctured code, one must substitute null symbols for the deleted symbols at the input to the Viterbi decoder. Null symbols can be symbols quantized to levels corresponding to weak '1's or weak '0's, or special flag symbols that result in no change to the accumulated error metric from the previous state when processed by the ACS circuits in the decoder.

Figure 7:
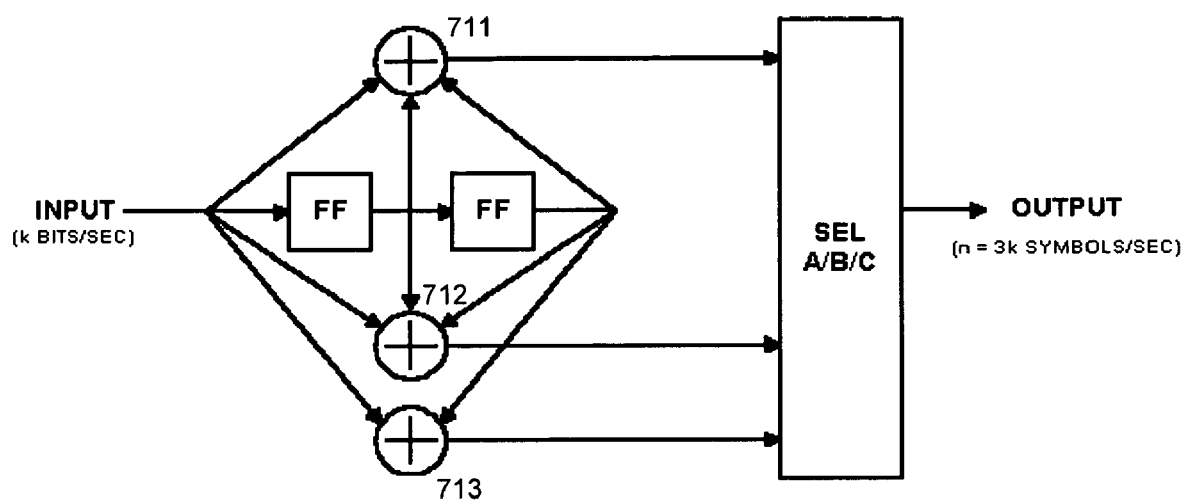
FIG. 7 shows an encoder for encoding a rate 1/3, K=3, (7, 7, 5) code.

FIG. 7 shows an encoder for encoding a rate 1/3, K=3, (7, 7, 5) code. This encoder has three modulo-two adders (XOR gates) 711, 712, 713. Therefore, for each input bit, the encoder can produce three channel symbol outputs. With suitable puncturing patterns, one can also create higher-rate codes using this encoder.

The present invention has three major components. The first is the use of multi-level coding in high data rate (e.g., Ultra-Wide Band (UWB)) systems with a pair of constituent encoders that produce two bits separately for the Most Significant Bits (MSBs) and Least Significant Bits (LSBs), allowing for reduced decoder complexity. The second major component is an interleaver and constellation labeling structure that allows parallel de-interleaving and reduced latency at the receiver. The third major component is a block interleaver that jointly optimizes the symbol hamming distance of the symbols and the bit hamming distance of each constituent encoder for the MSBs and LSBs.

Figure 8:
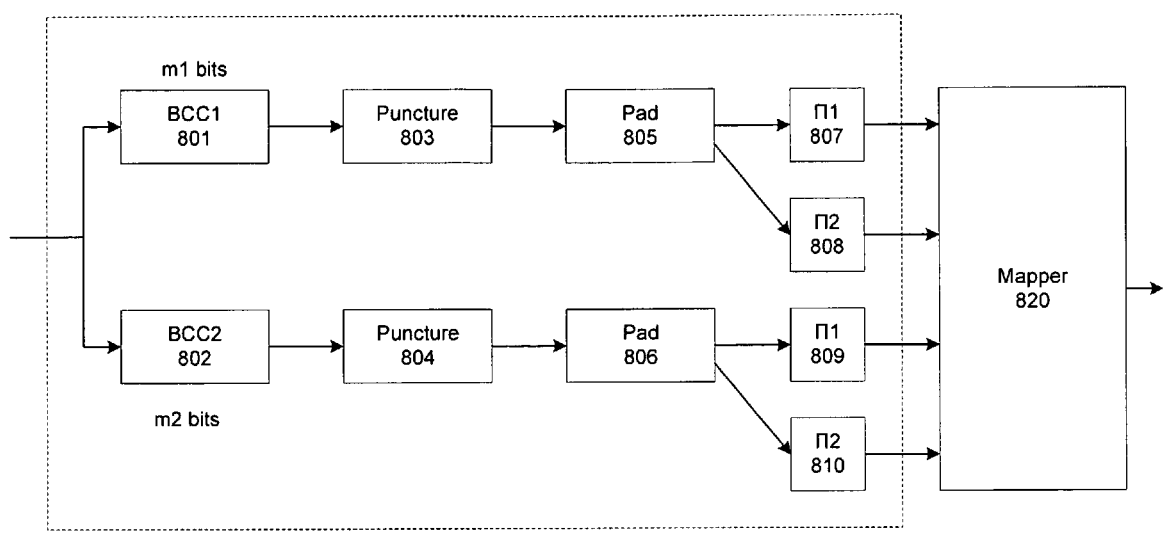
FIG. 8 is a block diagram of an encoder for parallel interleaving in accordance with the present invention.

FIG. 8 is a block diagram of an encoder for parallel interleaving in accordance with the present invention. The data stream to be encoded is divided between two parallel binary convolutional encoders 801, 802. The top encoder 801 is smaller than the lower one 802. For example, in one embodiment of the present invention, encoder 801 is an 8-state encoder, while encoder 802 is a 64-state encoder. The top encoder 801 is smaller because the partitioning of the bits (described below) produces a Signal-to-Noise Ratio (SNR) gain for the top encoder, which allows it to use a reduced constraint length. The encoded data is then punctured by components 803, 804 using the process described above.

The bits are partitioned into Most Significant Bits (MSBs) generated by pad 805 and Least Significant Bits (LSBs) generated by pad 806. The MSBs and LSBs are then fed into parallel interleavers 807-810. Interleavers 807, 808 interleave the MSBs and interleavers 809, 810 interleave the LSBs.

The interleaved bits are then mapped to a QAM constellation (e.g., 16 QAM) by the mapper 820. The mapping of the MSBs is a function of the LSBs. In the prior art, each MSB might be a function of two LSBs. For example, the MSB from interleaver 807 ($MSB_0$) might be a function of the LSB from either of interleaver 809 ($LSB_0$) or 810 ($LSB_1$).

The present invention, by contrast, employs a more precise interleaving structure, in which each MSB is a function of only one LSB. Therefore, using the example in FIG. 8, the MSB from interleaver 807 ($MSB_0$) is a functional only of the LSB from interleaver 809 ($LSB_0$). Similarly, the MSB from interleaver 808 ($MSB_1$) is a function only of the LSB from interleaver 810 ($LSB_1$).

The additional constraint provided by this more precise parallel interleaving structure of the present invention allows parallel de-interleaving at the decoder (explained in more detail below). Two interleavers for the LSBs allow for bit interleaving, which allows for better system performance.

The interleaver structure design allows latency to reduce from three interleaver latencies to single interleaver latency at the receiver (explained in more detail below), which allows the design to meet Short Inter-Frame Space (SIFS) requirements.

Figure 9:
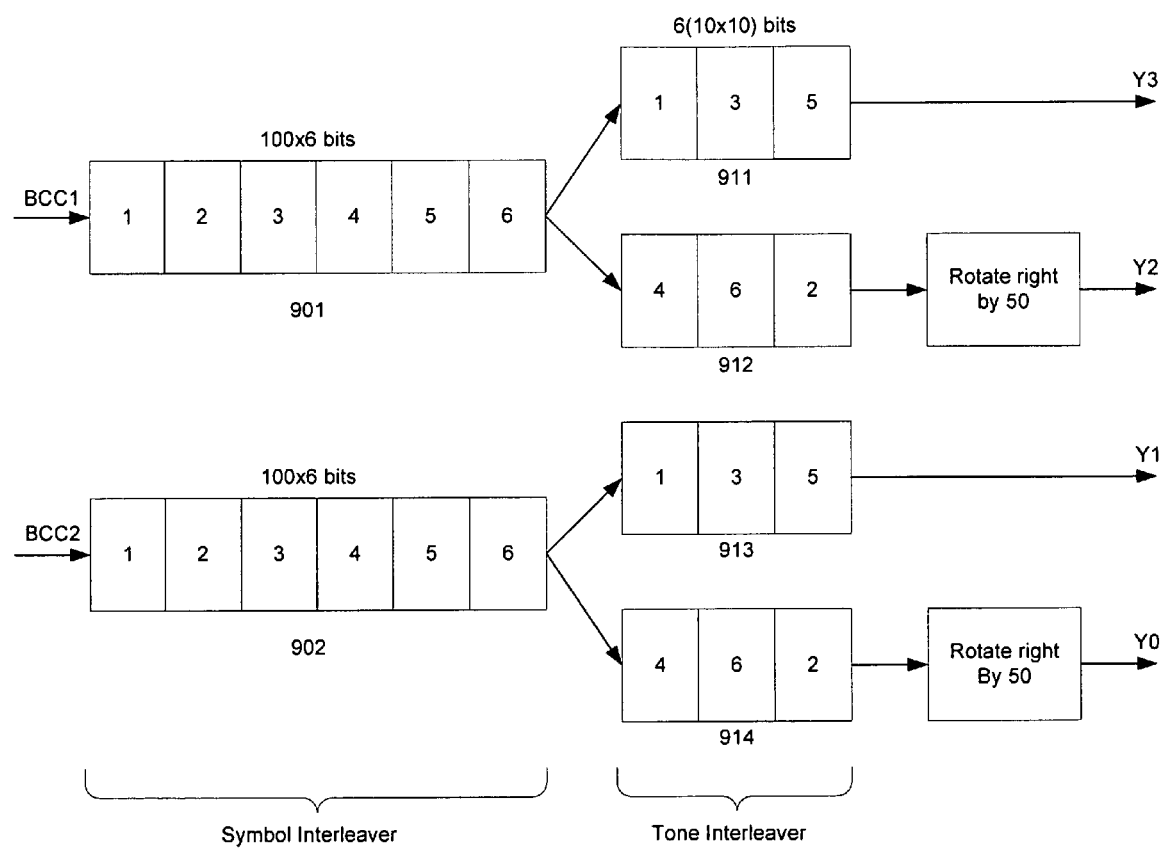
FIG. 9 is a block diagram illustrating joint a symbol and tone interleaver design for a UWB system in accordance with the present invention.

FIG. 9 is a block diagram illustrating joint a symbol and tone interleaver design for a UWB system in accordance with the present invention. This figure depicts a more detailed view of the parallel interleavers from FIG. 8. The first stage symbol interleavers 901, 902 assure that the hamming distance for encoders BCC1 and BCC2 is sufficient for assuming statistically independent fading on each bit at the output of the decoder.

The second stage tone interleavers 911-914 assure that fading tones do not create corrupted bits from the MSBs and LSBs for the same error event path in either decoder of BCC1 and BCC2. In other words, the cyclical shift of half the longest interleaver depth of the first stage symbol interleaver effectively performs another symbol interleaving at the 16 QAM level, whereas the first stage interleaving performs a bit interleaving at the Ungerboeck partition level.

The tone interleavers 911-914 in FIG. 9 illustrate the parallel interleaving structure used in mapping the MSBs and LSBs. As can be seen, the bit interleaving in tone interleaver 911 is identical to that of tone interleaver 913. Similarly the interleaving for tone interleavers 912 and 914 are also identical.

Figure 10:
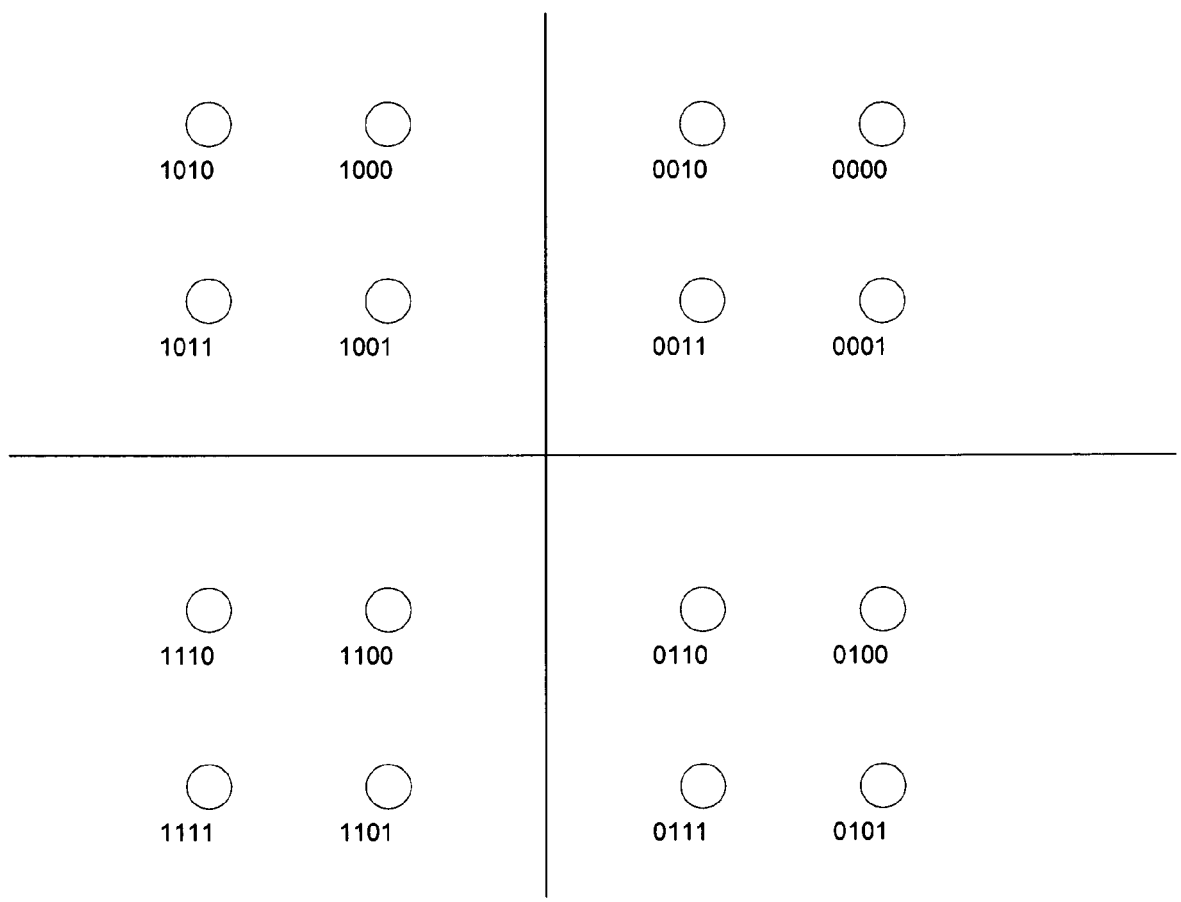
FIG. 10 shows the constellation labeling used in the present invention.

FIG. 10 shows the constellation labeling used in the present invention. The constellation illustrates the conversion of the digital bits to analog signals. The 4-digit numbers (symbols) are from the interleavers. Each quadrant represents different signal amplitudes. The mapping is such that there is a constant distance between each point. For example, point 0010 might be three times the amplitude of point 0011. The distance between points 1000 and 0010 is the same as the distance between 1001 and 0011.

This labeling allows In-phase and Quadrature (I&Q) channel decisions to be independent. By making Branch Metric selection of each MSB dependent on just one LSB, the labeling allows interleaver reuse and parallel de-interleaving, as well as simple bit metric calculations (i.e. reduced soft decision making).

The (1, 1) point, which is the point 0011 in the constellation, is mapped to (13, 13) for finite precision in hardware. This point makes scaling for Binary Phase Shift Keying (BPSK) to 41, Quadrature Phase Shift Keying (QPSK) to 29, and the 0000 16-QAM point to (39, 39). This choice maximizes the quantization error due to finite precision at the transmitter while minimizing the average transmit power differences as different modulation schemes are sent over the air.

For the multi-level coding, constellation points are selected from a 16 Quadrature Amplitude Modulation (QAM) constellation that has independent coding on each bit of the 4-bit symbol. Traditionally, independent coding is accomplished using separate encoders for each bit. In the present invention, the two LSBs for the 16 QAM point are generated from one encoder and the two MSBs are generated from a second encoder.

This configuration utilizes the punctured rate 1/3 mother convolutional code of the IEEE 802.15.3a task group (Multiband OFDM Alliance (MBOA) specifications) for the coding of LSBs. It allows for a high rate, low complexity encoder of the MSBs, which benefits from additional 6 dB gain in Euclidean distance based on Ungerboeck 4-way.

The multi-level coding exploits a constellation labeling scheme that allows for simplified bit metric calculation and parallel de-interleaving on the MSBs and LSBs, which minimizes latency in the system.

The configuration of the present invention provides a 240% increase in data rate over the highest rate of current MBOA specification. This increased data rate is achieved with a 6.67% increase in the system clock frequency and a 4% increase in chip size for the decoder compared to the MBOA specification, with no loss in performance or increased latency.

In cases of additive white Gaussian noise (AWGN) in the system, the MSB encoders are turned off to provide increased data rates without loss of performance.

Figure 11:
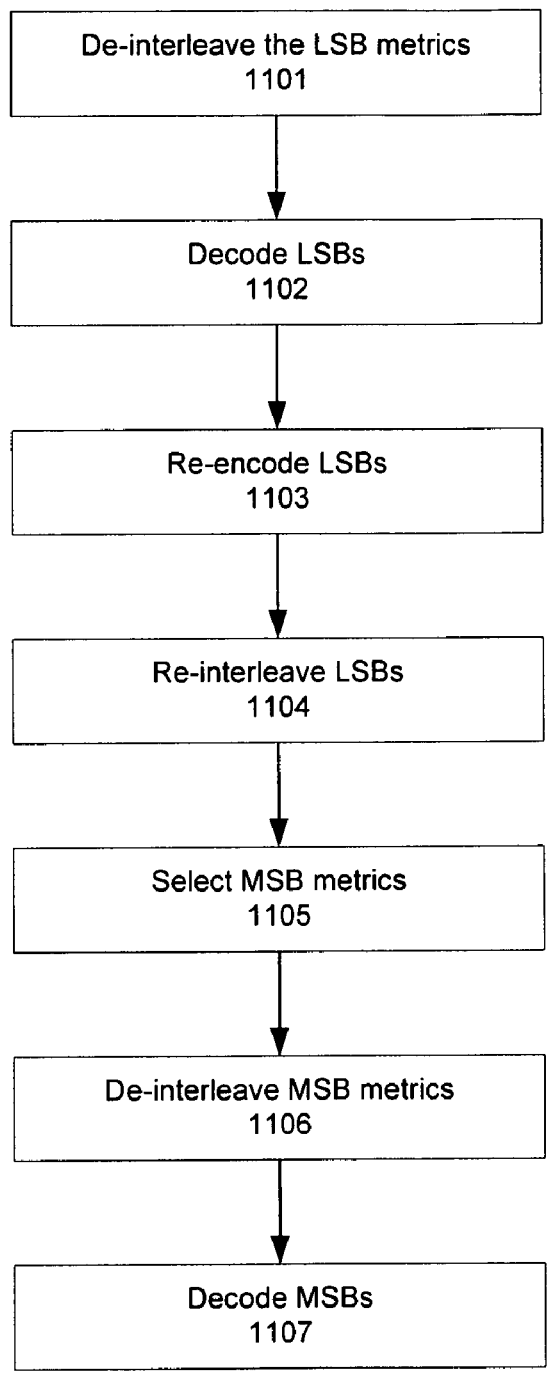
FIG. 11 illustrates the prior art process of decoding signals.

FIG. 11 illustrates the prior art process of decoding signals. Because the MSBs are a function of the LSBs, the process begins by de-interleaving the LSB metrics (step 1101) and then decoding the LSBs (step 1102), which allows the receiver to determine the MSBs. The LSBs are then re-encoded (step 1103) and re-interleaved (step 1104).

The receiver then selects the MSB metrics (step 1105), de-interleaves them (step 1106), and decodes the MSBs (step 1107).

This process therefore involves three interleaving latencies at steps 1101, 1104, and 1106. It is these three latencies that create the bottle neck in the decoding process and limit overall performance. The receiver has a limited latency budget (e.g., 10 μs) before it must transmit an acknowledge signal back to the transmitter. Using the prior art coding method, the receiver generally requires a total interleaving latency of 7.2 μs, preventing accommodation of Gbps speeds.

Figure 12:
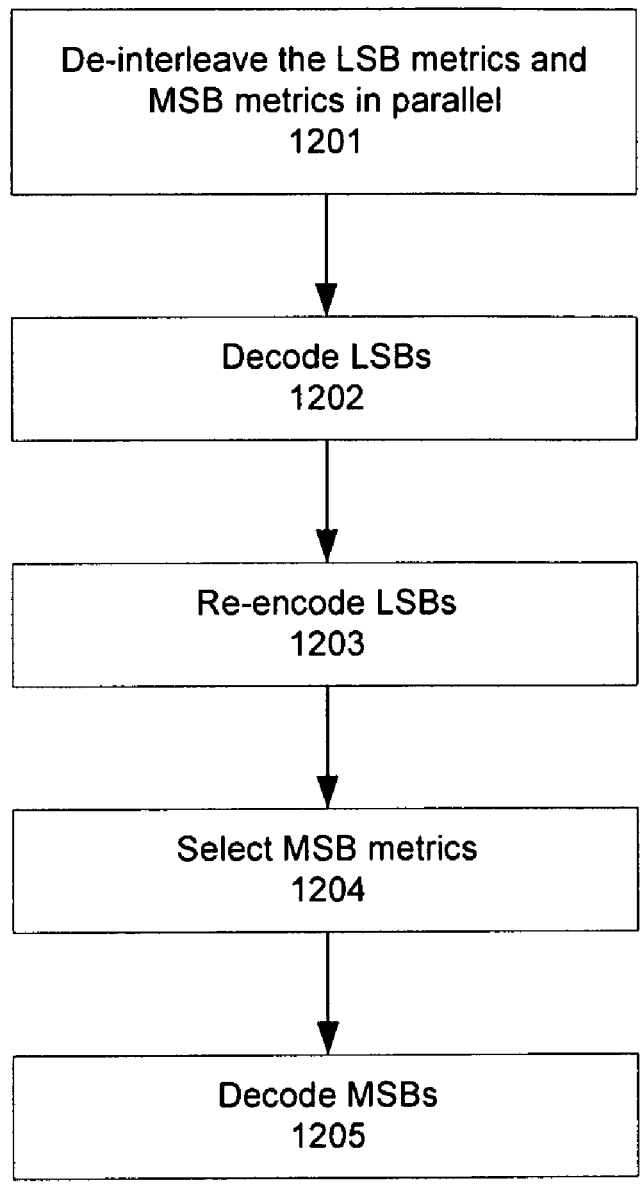
FIG. 12 illustrates the process of decoding signals in accordance with the present invention.

FIG. 12 illustrates the process of decoding signals in accordance with the present invention. In this process, the LSB metrics and MSB metrics are both de-interleaved in parallel in the first step 1201. The receiver then decodes the LSBs in order to determine the MSBs (step 1202). The LSBs are then re-encoded (step 1204). The receiver can now select the MSB metrics (step 1204) and decode the MSBs (step 1205).

Because of the interleaving structure used in the encoding process of present invention, the receiver can reduce the interleaving latencies from three to one, producing a latency of only 2.4 μs in one embodiment of the present invention. Because the LSBs and MSBs can be de-interleaved in parallel in the first step, the receiver requires only one de-interleaving step. Not only does the present invention increase performance, but it also allows for reduced complexity in the receiver hardware by reducing the number of required interleavers. The method of the present invention is also backward compatible with current receivers.

The parallel de-interleaving of the LSBs and MSBs at the receiver has two requirements. The first is that the MSBs are a function of only one LSB, instead of two as is done in the prior art. This makes the bit metric calculations easier. The second requirement is that the alternative interleavers are identical, as illustrated in FIG. 9 (i.e. interleaver 911 is a function of interleaver 913).

The following example is for a 1.024 Gbps system. The MSB encoder in this example equals an 8-state at base rate 1/3. The LSB encoder equals a 64-state at base rate 1/3. The generator polynomial for the MSBs is [13 15 17], and the generator polynomial for the LSBs is [155 127 1171] (the same as the one for 802.15.3a).

The puncture patterns for the MSB encoder are:
% rate 1/2
Puncture pattern=[1; 0; 1]
% rate 2/3
Puncture pattern=[1 1; 1 0; 0 0]
% rate 3/4
Puncture pattern=[0 0 0; 1 0 1; 1 1 0]
% rate 4/5
Puncture pattern=[1 0 1 1; 0 0 0 0; 1 1 0 0]
The puncture patterns for the LSB encoder are:
Rate 1/3"
Puncture pattern=[1; 1; 1]
Rate 11/32:
Puncture pattern=ones ([3 11]);
Puncture pattern (3, 11)=0
Rate 1/2:
Puncture pattern=ones ([3 1]);
Puncture pattern (2)=0
Rate 5/8:
Puncture pattern=[1 0 1 0 1; 1 0 1 0 1; 0 1 0 1 0]
Rate 3/4:
Puncture pattern=[1 0 0; 1 0 0; 0 1 1]
Rate 4/5:
Puncture pattern=[0 1 1 1; 1 0 0 0; 0 1 0 0]
Rate 7/8:
Puncture pattern=[0 0 1 0 0 0 0; 0 0 1 0 0 1 1; 1 1 0 1 1 0 0]

Table 11 shows the maximum data rate in mode with 4/5 coding on MSBs and LSBs.

TABLE 11

| MSB rates | LSB rates | Net rate | Data rate (Mbps) |
|---|---|---|---|
| 4/5 | 4/5 | 4/5 | 1024 |
| 1 (uncoded) | 4/5 | 9/10 | 1152 |
| 1/2 | 1/2 | 1/2 | 640 |
| 1 (uncoded) | 1/2 | 3/4 | 960 |
| 2/3 | 2/3 | 2/3 | 853.3 |
| 3/4 | 2/3 | 17/25 | 906.7 |
| 1 (uncoded) | 2/3 | 5/6 | 1066.7 |
| 1/3 | 1/3 | 1/3 | 426.7 |
| 1 (uncoded) | 1/3 | 2/3 | 853.3 |

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated. It will be understood by one of ordinary skill in the art that numerous variations will be possible to the disclosed embodiments without going outside the scope of the invention as disclosed in the claims.

We claim:

1. A method for encoding data for wireless data transmission, comprising:
    (a) partitioning data into Most Significant Bits (MSBs) and Least Significant Bits (LSBs);
    (b) encoding the MSBs with a first encoder;
    (c) encoding the LSBs with a second encoder; and
    (d) interleaving the MSBs and LSBs, wherein each MSB is a function of one LSB, wherein MSB metrics and LSB metrics may be de-interleaved in parallel by a receiver, reducing the latency of the receiver.

2. A method for encoding data for wireless data transmission, comprising:
    (a) partitioning data into Most Significant Bits (MSBs) and Least Significant Bits (LSBs);
    (b) encoding the MSBs with a first encoder;
    (c) encoding the LSBs with a second encoder; and
    (d) interleaving the MSBs and LSBs, wherein each MSB is a function of one LSB, wherein MSB metrics and LSB metrics may be de-interleaved in parallel by a receiver, reducing the latency of the receiver, and
    interleaving symbols such that the hamming distance for the first encoder and second encoder is sufficient for assuming statistically independent fading on each bit at the output of a decoder.

3. The method according to claim 1, wherein step (d) further comprises:
    interleaving tones such that fading tones do not create corrupted bits from the MSBs and LSBs for the same error event path in either decoder of the first encoder or the second encoder.

4. The method according to claim 1, wherein constellation points are selected from a Quadrature Amplitude Modulation (QAM) constellation that has independent coding on each bit of a symbol generated by step (d).

5. The method according to claim 4, wherein the QAM constellation is a 16 QAM constellation.

6. The method according to claim 1, wherein if additive white Gaussian noise (AWGN) is present, the first encoder is turned off.

7. The method according to claim 1, wherein two MSB sequences are generated from the first encoder.

8. The method according to claim 1, wherein two LSB sequences are generated from the second encoder.

9. The method according to claim 1, wherein encoding of the LSBs utilizes a punctured rate 1/3 mother convolutional code.

10. The method according to claim 1, wherein, because each MSB is a function of only one LSB, branch metric calculations during Viterbi decoding are simpler than if each MSB was a function of more than one LSB.

11. The method according to claim 1, wherein the parallel de-interleaving of MSB and LSM metrics allowed by step (d) reduces receiver complexity by reducing the number of required interleavers.

12. An apparatus for encoding data for wireless data transmission, comprising:
(a) a partitioner for partitioning data into Most Significant Bits (MSBs) and Least Significant Bits (LSBs)
(b) a first encoder for encoding the MSBs;
(c) a second encoder for encoding the LSBs; and
(d) a plurality of interleavers for interleaving the MSBs and LSBs, wherein each MSB is a function of one LSB, wherein MSB metrics and LSB metrics may be de-interleaved in parallel by a receiver, reducing the latency of the receiver.

13. The apparatus according to claim 12, wherein the interleavers further comprise:
symbol interleavers for interleaving symbols such that the hamming distance for the first encoder and second encoder is sufficient for assuming statistically independent fading on each bit at the output of a decoder.

14. The apparatus according to claim 12, wherein the interleavers further comprise:
tone interleavers for interleaving tones such that fading tones do not create corrupted bits from the MSBs and LSBs for the same error event path in either decoder of the first encoder or the second encoder.

15. The apparatus according to claim 12, wherein if additive white Gaussian noise (AWGN) is present, the first encoder is turned off.

16. The apparatus according to claim 12, wherein two MSB sequences are generated from the first encoder.

17. The apparatus according to claim 12, wherein two LSB sequences are generated from the second encoder.

18. The apparatus according to claim 12, wherein the first encoder is an 8-state encoder and the second encoder is a 64-state encoder.

19. The apparatus according to claim 12, wherein the second encoder of the LSBs utilizes a punctured rate 1/3 mother convolutional code.

20. The apparatus according to claim 12, wherein the parallel de-interleaving of MSB and LSM metrics allowed by step (d) reduces receiver complexity by reducing the number of required interleavers.

21. An apparatus for encoding data for wireless data transmission, comprising:
means for partitioning data into Most Significant Bits (MSBs) and Least Significant Bits (LSBs);
means for encoding the MSBs with a first encoder;
means for encoding the LSBs with a second encoder; and
means for interleaving the MSBs and LSBs, wherein each MSB is a function of one LSB, wherein MSB metrics and LSB metrics may be de-interleaved in parallel by a receiver, reducing the latency of the receiver.

22. A transmitter for encoding data for wireless data transmission, comprising:
at least one antenna configured to transmit data to a receiver;
a partitioner for partitioning data into Most Significant Bits (MSBs) and Least Significant Bits (LSBs);
a first encoder for encoding the MSBs;
a second encoder for encoding the LSBs; and
a plurality of interleavers for interleaving the MSBs and LSBs, wherein each MSB is a function of one LSB, wherein MSB metrics and LSB metrics may be de-interleaved in parallel by the receiver, reducing the latency of the receiver.

* * * * *

UNITED STATES PATENT AND TRADEMARK OFFICE
CERTIFICATE OF CORRECTION

| | | |
|---|---|---|
| PATENT NO. | : 7,684,505 B2 | Page 1 of 1 |
| APPLICATION NO. | : 11/114752 | |
| DATED | : March 23, 2010 | |
| INVENTOR(S) | : Rajagopal et al. | |

It is certified that error appears in the above-identified patent and that said Letters Patent is hereby corrected as shown below:

Column 14, line 55, claim 2: "and second" to read as --and the second--

Column 15, line 18, claim 11: "LSM" to read as --LSB--

Column 15, line 35, claim 13: "and second" to read as --and the second--

Column 16, line 15, claim 20: "LSM" to read as --LSB--

Signed and Sealed this
Twenty-eighth Day of June, 2011

David J. Kappos
*Director of the United States Patent and Trademark Office*